United States Patent [19]
Hirai et al.

[11] Patent Number: 5,636,999
[45] Date of Patent: Jun. 10, 1997

[54] SURFACE MOUNTING TYPE OF CONNECTOR FOR IC CARDS

[75] Inventors: Yuji Hirai; Kiyoshi Sato, both of Tokyo, Japan

[73] Assignee: Honda Tsushin Kogyo Kabushiki Kaisha, Tokyo, Japan

[21] Appl. No.: 387,086

[22] Filed: Feb. 15, 1995

[30] Foreign Application Priority Data

Sep. 13, 1994 [JP] Japan .................... 6-218998

[51] Int. Cl.$^6$ ........................................... H01R 23/70
[52] U.S. Cl. ................................... 439/79; 439/541.5
[58] Field of Search ...................... 439/79, 80, 64, 439/541.5, 660, 61, 377

[56] References Cited

U.S. PATENT DOCUMENTS 4,909,746  3/1990  Scholz ........................ 439/82
5,225,968  7/1993  Ma ............................ 439/541.5
5,290,174  3/1994  Woratyla et al. .

FOREIGN PATENT DOCUMENTS 0 595 025  5/1994  European Pat. Off. .

Primary Examiner—Neil Abrams
Attorney, Agent, or Firm—Armstrong, Westerman, Hattori, McLeland & Naughton

[57] ABSTRACT

A surface mounting type of connector for IC cards has a connector main body having two sets of electric contacts for connection to electric contacts of respective connectors provided in two IC cards. Contact portions of each set of the electric contacts are disposed in two rows in one direction to lie in a direction perpendicular to the one direction. The connector main body has a fitting recess formed in a lower portion thereof. Terminal portions of the two sets of electric contacts are arranged so as to lie exposed in two rows parallel to each other along facing side walls of the fitting recess. A terminal member having two parallel rows of terminal pieces to be connected to a wiring circuit board is fitted into the fitting recess such that the terminal pieces urgingly contact the terminal portions.

3 Claims, 4 Drawing Sheets

SURFACE MOUNTING TYPE OF CONNECTOR FOR IC CARDS

BACKGROUND OF THE INVENTION

1. Field of the Invention

The present invention relates to a surface mounting type of connector for IC (integrated circuit) cards, which connector is to be assembled into an electronic communication equipment or the like.

2. Description of Related Art

There has hitherto been known such a connector for IC cards as is connected to two IC cards.

In this kind of connector there are disposed in a connector main body, in a vertical (i.e., up and down) positional relationship to each other, two sets of electric contacts which are respectively connected to connectors of the two IC cards. Each set of electric contacts are arranged with their contact portions being arranged in two upper and lower rows so as to lie in the right and left direction. Its terminal portions are arranged in a single row so as to lie in the right and left direction. The terminal portions are inserted into perforations which are formed in an electrically conductive portion of a wiring circuit board, and are thereafter soldered for mounting on the wiring circuit board.

In this type of connector there are disadvantages in that, when it is mounted on the wiring circuit board on both sides of which are mounted semiconductors and other circuit parts or devices, the ratio of mounting (or packaging) the parts (or devices) onto the wiring circuit board becomes smaller, and that their mounting is time-consuming. It is therefore desirable to improve the connector to a surface mounting type.

However, in case the connector having the above-described construction of arranging electric contacts is improved by modification into a surface mounting type of connector, there are the following problems. Namely, when the terminal portions of the electric contacts are soldered to electrically conductive pads of the wiring circuit board, the solder may sometimes short-circuit the electrically conductive pads. Or else, in order to enable to repair the terminal portions in case they fail to be correctly bonded or soldered to the electrically conductive pads, it is necessary to arrange two upper and lower sets of electric contacts which are respectively arranged in a row and in parallel with each other further into a single row which extends outside the connector main body. If this kind of arrangement is employed, when the respective pitch of arrangement in the two upper and lower rows within each set of electric contacts is as small as 1.27 mm, for example, the pitch at the terminal portions of each set as arranged into a single row becomes as small as 0.635 mm. The pitch becomes further as small as half the above figure when the two sets are arranged into a single row. It follows that they cannot practically be used or put into commercial use.

An object of the present invention is to provide a surface mounting type of connector for IC cards comprising a connector main body having two sets of electric contacts for connection to electric contacts of respective connector portions in two IC cards, contact portions of each set of the electric contacts being disposed in two rows in one direction to lie in a direction perpendicular to said one direction, in which the electric contacts can be easily soldered to electrically conductive pads of the wiring circuit board even if the pitch of arrangement of the electric contacts is small, in which the short-circuiting with the solder at the time of soldering and/or incomplete soldering of the terminal portions of the electric contacts to the electrically conductive pads can be easily repaired, and in which the ratio of mounting or packaging of the parts or devices onto the wiring circuit board can be improved.

SUMMARY OF THE INVENTION

In order to attain the above and other objects, the present invention is a surface mounting type of connector for IC cards comprising a connector main body having two sets of electric contacts for connection to electric contacts of respective connectors provided in two IC cards, contact portions of each set of the electric contacts being disposed in two rows in one direction to lie in a direction perpendicular to said one direction; wherein the connector main body has a fitting recess formed in a lower portion thereof; wherein terminal portions of the two sets of electric contacts are arranged so as to lie exposed in two rows parallel to each other along facing side walls of the fitting recess; and wherein a terminal member comprising two parallel rows of terminal pieces for connection to a wiring circuit board is fitted into the fitting recess such that the terminal pieces urgingly contact said terminal portions.

Preferably, the terminal pieces are supported on a supporting member, each of the terminal pieces has two substantially U-shaped bends, and that end of each of the terminal pieces which is closer to the circuit wiring board extends substantially in parallel with the wiring circuit board.

Preferably, a projection is provided on a lower surface of the connector main body such that, when the connector main body is placed on the wiring circuit board, a predetermined clearance is formed between the connector main body and the wiring circuit board.

According to the above-described arrangement of the present invention, when the connector is surface-mounted or mounted on the surface of the wiring circuit board, the terminal member is mounted in advance on the electrically conductive pads of the wiring circuit board. The terminal pieces for connection to the wiring circuit board are then soldered to the respective electrically conductive pads by reflow soldering. The soldered conditions are checked and, if defective soldering should be found, it is repaired. Then, the fitting recess of the connector main body is fitted onto the terminal member to thereby mount the connector main body onto the wiring circuit board. In this manner, the electric contacts can be connected to those terminal pieces for connection to the wiring circuit board which are brought into urging contact with the terminal portions, thereby connecting the electric contacts to the electrically conductive pads of the wiring circuit board via the terminal pieces. Since the terminal pieces for connection to the wiring circuit board are disposed in two rows, the pitch of their arrangement becomes larger than that where they are arranged in a single row. It follows that the soldering work becomes easier even with a smaller pitch of arrangement of the electric contacts.

Further, when the connector main body is mounted on the wiring circuit board while maintaining a clearance by means of the protection which is provided on the lower surface thereof, the parts or devices can be mounted also on the wiring circuit board must below the connector main body. The ratio of mounting (or packaging) the parts (or devices) on the wiring circuit board can therefore be improved.

BRIEF DESCRIPTION OF THE DRAWINGS

The above and other objects and the attendant advantages of the present invention will become readily apparent by reference to the following detailed description when considered in conjunction with the accompanying drawings wherein.

DETAILED DESCRIPTION OF A PREFERRED EMBODIMENT

A detailed explanation of an embodying example of the present invention will now be made with reference to the accompanying drawings.

Figure 1:
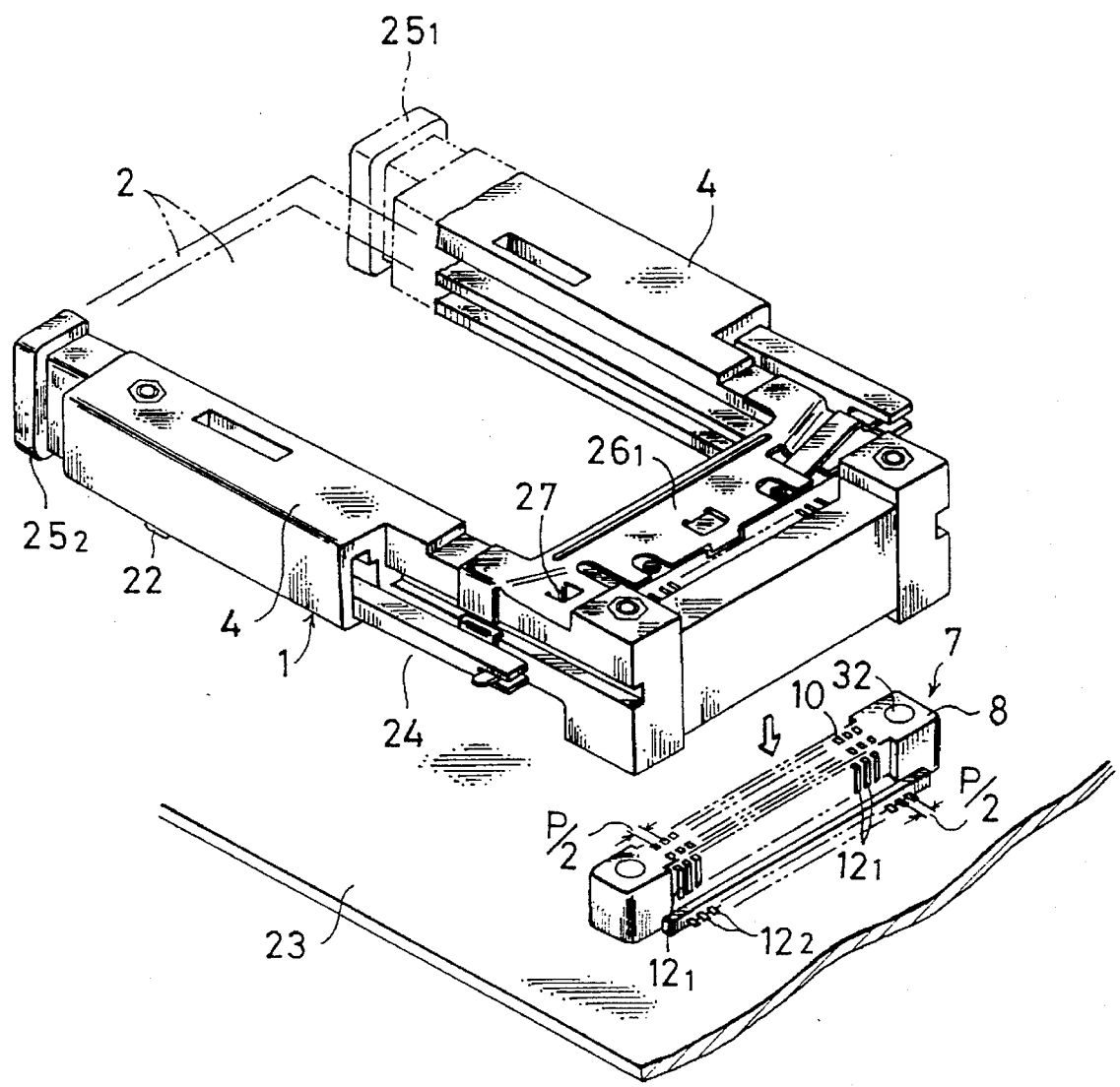
FIG. 1 is an exploded perspective view of one embodying example of the present invention.
Figure 2:
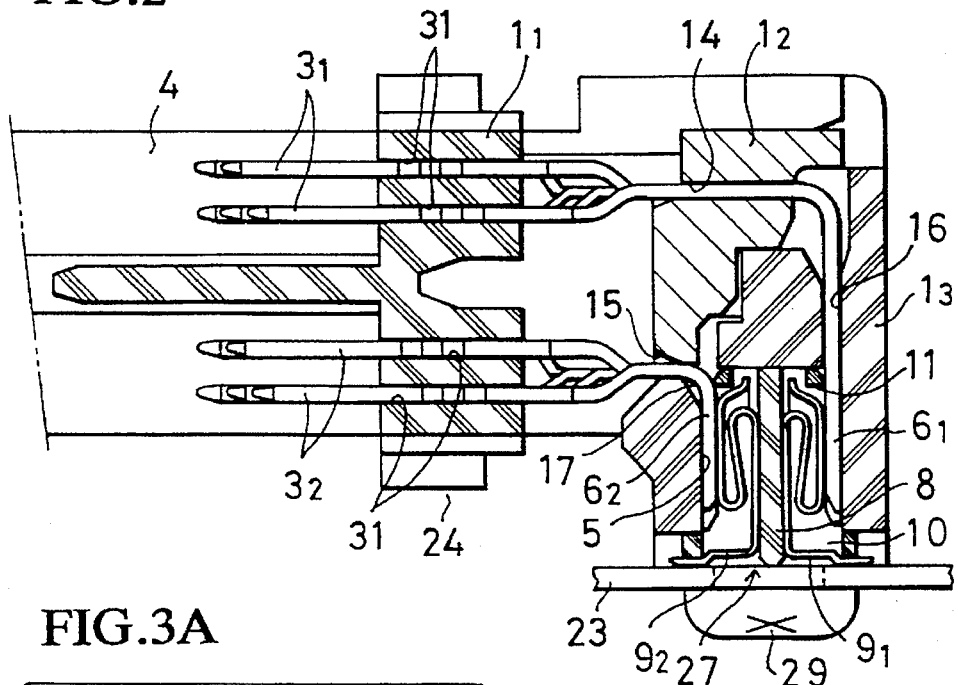
FIG. 2 is a cross-sectional view thereof.
Figure 3A:
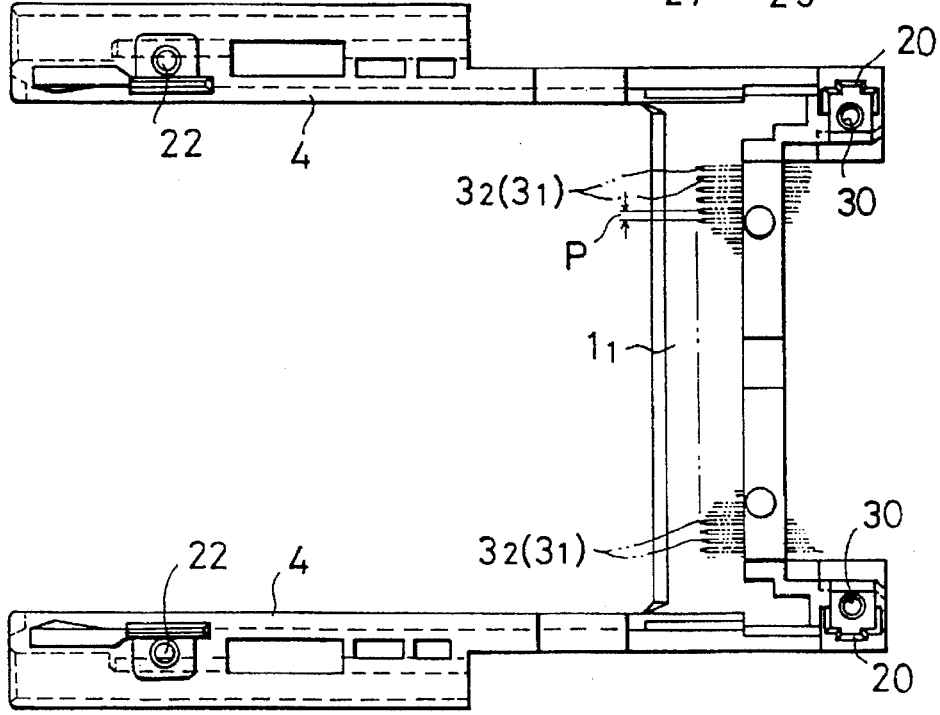
FIGS. 3A and 3B are a bottom view and a cross-sectional side view, respectively, of an electrically insulating member $1_1$.
Figure 3B:
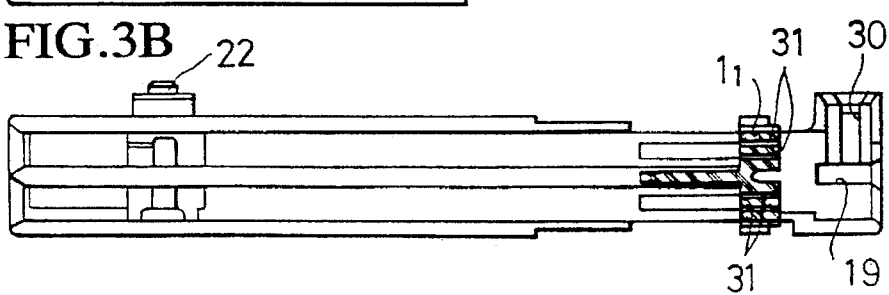
Figure 6:
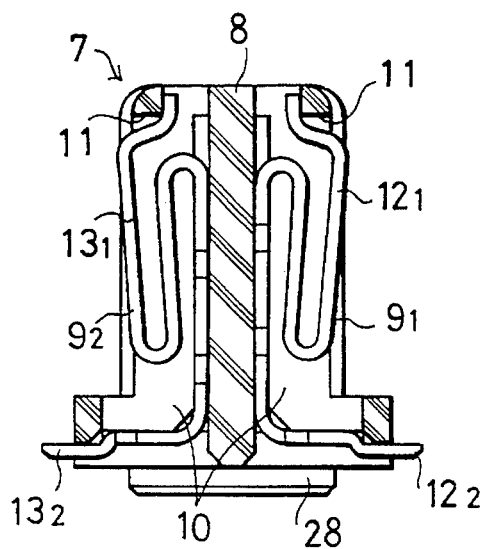
FIG. 6 is a cross-sectional view of a terminal member.

In FIG. 1, numeral 1 denotes a connector main body which is made of a synthetic resin or the like. This connector main body 1 is made up by assembling electrically insulating members (or insulators) $1_1$, $1_2$ and $1_3$ as shown in FIG. 2. In the electrically insulating member $1_1$ there are disposed in a vertical positional relationship two sets of electric contacts $3_1$, $3_1$ ..., $3_2$, $3_2$ ... which are to be respectively connected to connectors (not illustrated) of two IC cards 2, 2. In the present embodying example, the vertical, i.e., upper and lower, direction refers to a direction perpendicular to the direction in which the IC cards are inserted or ejected. On the right and the left sides of a portion in which the electric contacts are mounted, there are provided, in a manner extending or projecting forwards, leg portions 4, 4 for guiding and supporting the IC cards 2, 2. As can be clearly seen in FIGS. 2, 3A, 4 and 8, the electric contacts $3_1$, $3_1$ ..., $3_2$, $3_2$ ... of each set are arranged to lie in the right and the left direction at a pitch (P) of 1.27 mm, for example, respectively in two vertical (i.e., upper and lower) rows. They are bent behind the portion in which the electrically insulating member $1_1$ is mounted so as to be arranged on the same plane. It follows that the pitch of arrangement of the electric contacts on the respective planes becomes 0.635 mm (P/2). The electric contacts $3_1$, $3_1$ ... are disposed, via an electrically insulating member $1_2$, on or along one side of a fitting recess 5 which is formed in a lower surface or in the lower portion of the electrically insulating member $1_3$. The contacts $3_2$, $3_2$ ... are disposed, via the electrically insulating member $1_2$, on or along the other side, that is opposite to the above-described one side, of the fitting recess 5. Both the contacts $3_1$, $3_1$ ..., $3_2$, $3_2$ ... thus arranged respectively constitute terminal portions $6_1$, $6_1$ ..., $6_2$, $6_2$ ... Numeral 7 denotes a terminal member which is made up of a supporting member 8 of an electrically insulating material and terminal pieces $9_1$, $9_1$ ..., $9_2$, $9_2$, ... for connection to a wiring circuit board. As is clearly shown in FIGS. 1 and 6, the supporting member 8 is provided with perforations 10, 10 ... which are formed in two rows at the same pitch as the one (P/2) at which the terminal portions $6_1$, $6_1$ ..., $6_2$, $6_2$ ... of the electric contacts $3_1$, $3_1$ ..., $3_2$, $3_2$ ... are arranged. The perforations 10, 10 ... of each row are respectively provided with slits 11, 11 ... which open into respective side surfaces in fluid flow communication with the respective perforations 10, 10 ... The terminal pieces $9_1$, $9_1$ ..., $9_2$, $9_2$, ... for connection to the wiring circuit board are bent into a U-shape at two points. One end $12_1$, $12_1$ ... $13_1$, $13_1$ ... of each of them projects outwards beyond the slit 11, and the other end $12_2$, $12_2$ ..., $13_2$, $13_2$ ... thereof projects outwards, as a terminal portion for connection to the wiring circuit board, beyond each of the side walls such that it becomes substantially flush or on the same level with the bottom surface of the supporting member 8. The terminal member 7 is thus arranged such that, in a condition in which it is fitted into the fitting recess 5, the above-described one end $12_1$, $12_1$ ... $13_1$, $13_1$ ... respectively contacts the terminal portion $6_1$, $6_1$ ..., $6_2$, $6_2$ ... of the electric contact $3_1$, $3_1$ ..., $3_2$, $3_2$ ... urgingly or in a biased manner through its resilient force.

Figure 4:
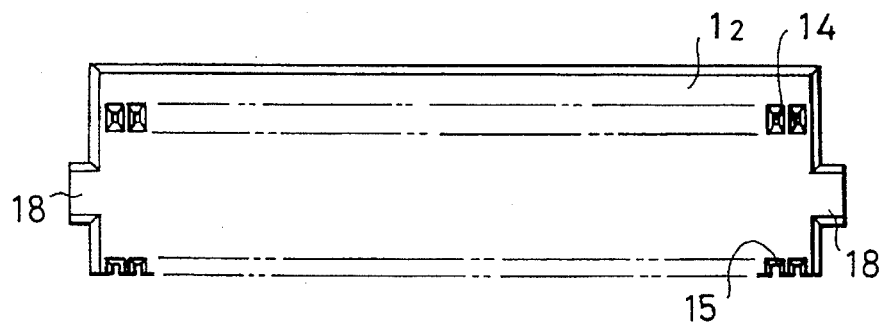
FIG. 4 is a front view of an electrically insulating member $1_2$.
Figure 5A:
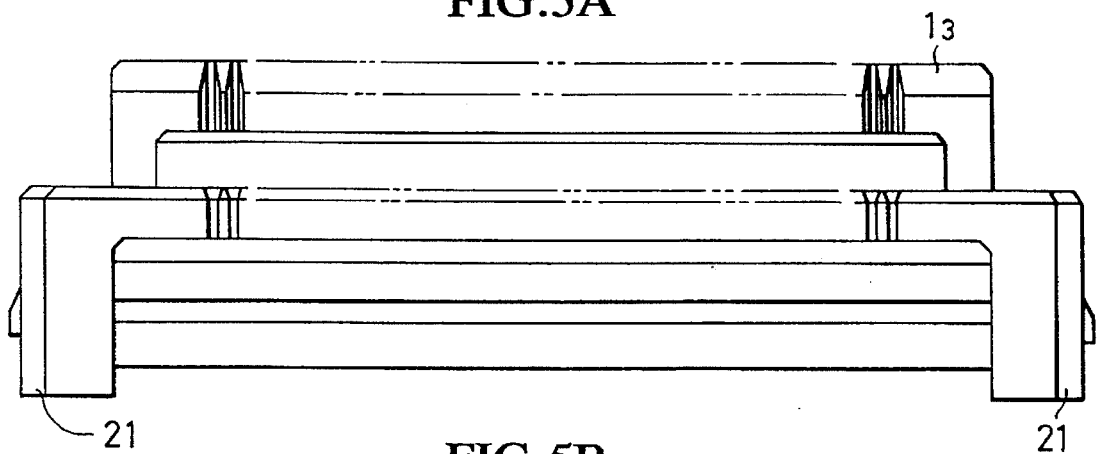
FIGS. 5A and 5B are a front view and a bottom view, respectively, of an electrically insulating member
Figure 5B:
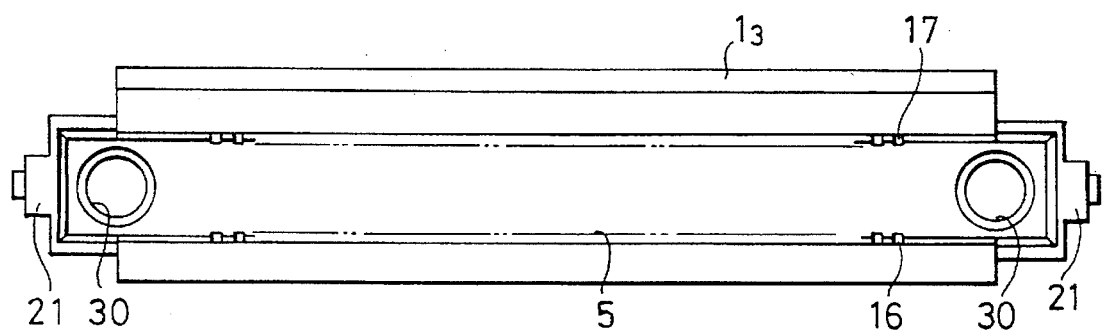
Figure 7:
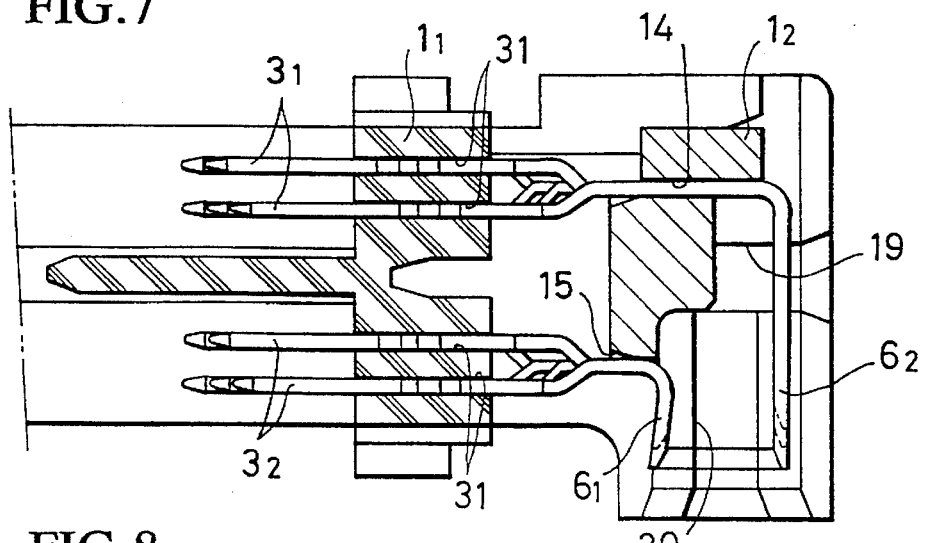
FIG. 7 is a cross-sectional view showing a condition in which the electrically insulating member $1_2$ is mounted on the electrically insulating member $1_1$.
Figure 8:
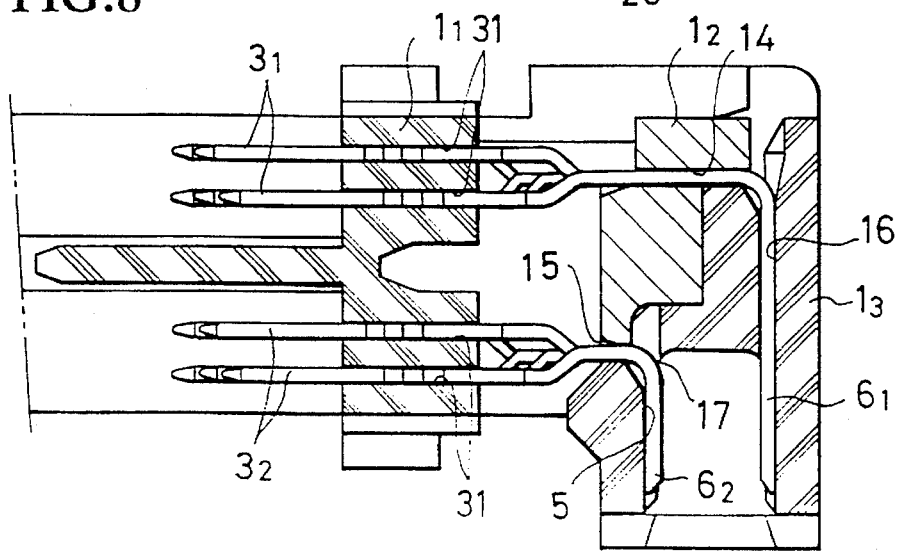
FIG. 8 is a cross-sectional view of an important portion of FIG. 1 showing a condition in which the electrically insulating members $1_2$ and $1_3$ are mounted on the electrically insulating member $1_1$.

In order to fit or mount the above-described two sets of upper and lower contacts $3_1$, $3_1$ ..., $3_2$, $3_2$ ... into the connector main body 1, the following procedures can be followed. Namely, as shown in FIG. 7, for example, the two sets of upper and lower contacts $3_1$, $3_1$ ..., $3_2$, $3_2$ ... are inserted from behind into perforations 31, 31 ... which are provided in the electrically insulating member $1_1$. Then, the electric contacts $3_1$, $3_1$ ..., $3_2$, $3_2$ ... that have been formed into respective rows by bending the exposed portions are fitted into perforations 14, 14 ..., 15, 15 ... in the electrically insulating member $1_2$, and are further bent at right angles. Then, as shown in FIG. 8, the electric contacts $3_1$, $3_1$ ..., $3_2$, $3_2$ ... are inserted into perforations 16, 16 ..., 17, 17, ... in the electrically insulating member $1_3$ to thereby dispose them along both opposite or facing side walls of the fitting recess 5. Terminal portions $6_1$, $6_1$ ..., $6_2$, $6_2$ ... are thus constituted. When the electrically insulating member $1_2$ is fitted into or mounted on the electrically insulating member $1_1$, projections 18, 18 on both sides of the electrically insulating member $1_2$ as shown in FIG. 4 are engaged with horizontal grooves 19 on both sides of the electrically insulating member $1_1$. When the electrically insulating member $1_3$ is fitted into or mounted on the electrically insulating member $1_1$, projections 21, 21 on both sides of the electrically insulating member $1_3$ as shown in FIG. 5 are engaged with vertical grooves 20 on both sides of the electrically insulating member $1_1$.

That lower portion of the electrically insulating member $1_3$ which is a part of the connector main body 1 is formed in a projecting shape. When the connector main body 1 is mounted onto the wiring circuit board 23 together with projections 22 which are formed on the above-described leg portions 4 of the electrically insulating member $1_1$, the connector main body 1 is set apart from the wiring circuit board 23 to form a clearance 24 therebetween. It is thus so arranged that parts or devices such as semiconductors or the like can be disposed in the clearance 24 on the wiring circuit board 23.

In FIG. 1, numerals $25_1$, $25_2$ denote those operating members for ejection of the upper and the lower IC cards 2, 2 which are mounted on the leg portions 4, 4 so as to be slidable in the forward and backward direction. Numeral $26_1$ denotes an ejecting plate for removing the upper IC card 2 out of the connector main body 1 by means of a claw piece 27 as a result of a forward movement of the ejecting plate $26_1$ when the operating member $25_1$ for ejection is moved backwards (i.e., in the direction of inserting the IC cards).

Though not illustrated, there is also provided an ejecting plate for removing the lower IC card 2 out of the connector main body 1 as a result of a forward movement of the ejector plate when the operating member $25_2$ for ejection is moved backwards. Numeral 28 in FIG. 6 denotes projections which are provided on both lower surfaces of the supporting member 8 for fixing it to the wiring circuit board 23.

An explanation will now be made about the operation or function of the connector of the present embodying example.

First, as shown in FIG. 1, the terminal member 7 is mounted on the wiring circuit board 23, and the terminal pieces $9_1, 9_1 \ldots, 9_2, 9_2 \ldots$ for connection to the wiring circuit board are bonded or soldered (at the above-described other ends $12_2, 12_2 \ldots, 13_2, 13_2 \ldots$) to electrically conductive pads of the wiring circuit board 23 by means of reflow soldering. Thereafter, the connector main body 1 is lowered from above to mount it on the wiring circuit board 23 by fitting the fitting recess 5 onto the terminal member 7. Tap bolts 29 (FIG. 2) are screwed into holes 30 in the connector main body 1 through the wiring circuit board 23 and holes 32 in the terminal member 7 to thereby fix the connector main body 1. Since there is formed the clearance 24 between the connector main body 1 and the wiring circuit board 23, the parts or devices such as semiconductors or the like can be mounted on the wiring circuit board 23 below the connector main body 1.

As described above, according to the present invention, there is provided, in the lower portion of the connector main body, the fitting recess for laying exposed those terminal portions of the contacts which are provided in two rows. The terminal member is fitted into the fitting recess and those terminal pieces of the terminal member which are to be connected to the wiring circuit board are made to urgingly contact the terminal portions of the electric contacts. Therefore, the terminal pieces for connection to the wiring circuit board can be soldered to the electrically conductive pads of the wiring circuit board by mounting only the terminal member onto the wiring circuit board. It can thus easily check the soldered conditions to repair defective soldering or the like. Further, since the terminal portions are provided in two rows, the soldering can be easily made even in case where the pitch of arranging the electric contacts is small. When there is formed in the connector main body a projection or projections for forming a clearance between the connector main body and the wiring circuit board, such parts or devices as semiconductors or the like can be disposed on the wiring circuit board below the connector main body. The ratio of mounting or packaging parts or devices on the wiring circuit board can thus be improved.

It is readily apparent that the above-described surface mounting type of connector for IC cards meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A surface mounting type of connector for integrated circuit (IC) cards, comprising: a connector main body having two sets of electric contacts for connection to electric contacts of respective connectors provided in two IC cards; and contact portions of each set of said electric contacts being disposed in two rows in one direction to lie in a direction perpendicular to said one direction, wherein said connector main body has a fitting recess formed in a lower portion thereof, wherein terminal portions of said two sets of electric contacts are arranged so as to lie exposed in two rows parallel to each other along facing side walls of said fitting recess, wherein a terminal member having two parallel rows of terminal pieces for surface mount connection to a wiring circuit board is fitted into said fitting recess such that said terminal pieces urgingly contact said terminal portions, wherein said terminal pieces include bent portions and are located between a supporting member and said terminal portions.

2. A surface mounting type of connector for integrated circuit (IC) cards according to claim 1, wherein each of said terminal pieces has two substantially U-shaped bends, and wherein that end of each of said terminal pieces which is closer to the circuit wiring board extends substantially in parallel with the wiring circuit board.

3. A surface mounting type of connector for integrated circuit (IC) cards according to claim 1, further comprising a projection on a lower surface of said connector main body such that, when said connector main body is placed on the wiring circuit board, a predetermined clearance is formed between said connector main body and the wiring circuit board.

* * * * *